(12) United States Patent
Yoshida et al.

(10) Patent No.: US 9,018,054 B2
(45) Date of Patent: Apr. 28, 2015

(54) METAL GATE STRUCTURES FOR FIELD EFFECT TRANSISTORS AND METHOD OF FABRICATION

(71) Applicants: Naomi Yoshida, Sunnyvale, CA (US); Adam Brand, Palo Alto, CA (US)

(72) Inventors: Naomi Yoshida, Sunnyvale, CA (US); Adam Brand, Palo Alto, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 13/815,734

(22) Filed: Mar. 15, 2013

(65) Prior Publication Data

US 2014/0264483 A1 Sep. 18, 2014

(51) Int. Cl.
| | | |
|---|---|---|
| *H01L 21/84* | (2006.01) | |
| *H01L 29/78* | (2006.01) | |
| *H01L 21/28* | (2006.01) | |
| *H01L 29/49* | (2006.01) | |
| *H01L 29/66* | (2006.01) | |
| *H01L 29/51* | (2006.01) | |

(52) U.S. Cl.
CPC ........ *H01L 29/785* (2013.01); *H01L 21/28079* (2013.01); *H01L 21/28088* (2013.01); *H01L 21/28194* (2013.01); *H01L 29/4958* (2013.01); *H01L 29/4966* (2013.01); *H01L 29/517* (2013.01); *H01L 29/66545* (2013.01)

(58) Field of Classification Search
CPC . H01L 27/00; H01L 29/785; H01L 21/28079; H01L 29/4966
USPC ......... 438/151, 197, 199, 275, 279, 163, 592; 257/262, 288, 367, 369, E51.006, 257/E27.06, E29.051, 240, 287, 368; 716/30–139
See application file for complete search history.

(56) References Cited

U.S. PATENT DOCUMENTS

| | | | |
|---|---|---|---|
| 7,105,934 B2 | 9/2006 | Anderson et al. | 257/900 |
| 7,396,710 B2 | 7/2008 | Okuno | 438/149 |
| 7,442,590 B2 | 10/2008 | Orlowski | 438/157 |
| 7,495,290 B2 | 2/2009 | Li | 257/369 |
| 7,923,266 B2 | 4/2011 | Thijs et al. | 438/14 |
| 8,017,463 B2 | 9/2011 | Chang | 438/197 |
| 8,067,287 B2 | 11/2011 | Baumgartner | 438/283 |
| 8,184,472 B2 | 5/2012 | Anderson et al. | 365/149 |
| 8,268,085 B2 | 9/2012 | Yeh et al. | 134/26 |
| 8,274,106 B2 | 9/2012 | Abbott et al. | 257/302 |
| 8,313,993 B2 | 11/2012 | Cho et al. | 438/199 |
| 8,362,568 B2 | 1/2013 | Lin et al. | 257/368 |

(Continued)

OTHER PUBLICATIONS

C. Auth, et al., "A 22nm High Performance and Low-Power CMOS Technology Featuring Fully-Depleted Tri-Gate Transistors, Self-Aligned Contacts and High Density MIM Capacitors." Symposium on VLSI Technoloy Digest of Technical Papers. 2012; 978-1-4673-0847-2/12, pp. 131-132, IEEE.

(Continued)

*Primary Examiner* — Jarrett Stark
*Assistant Examiner* — Shahed Ahmed
(74) *Attorney, Agent, or Firm* — Shirley L. Church, Esq.

(57) ABSTRACT

The present invention relates to combinations of materials and fabrication techniques which are useful in the fabrication of filled, metal-comprising gates for use in planar and 3D Field Effect Transistor (FET) structures. The FET structures described are of the kind needed for improved performance in semiconductor device structures produced at manufacturing nodes which implement semiconductor feature sizes in the 15 nm range or lower.

8 Claims, 10 Drawing Sheets

(56) References Cited

U.S. PATENT DOCUMENTS

| | | | |
|---|---|---|---|
| 8,368,146 B2 | 2/2013 | Basker et al. | 257/368 |
| 8,373,217 B2 | 2/2013 | Chang | 257/302 |
| 8,377,779 B1 | 2/2013 | Wang | 438/283 |
| 8,378,394 B2 | 2/2013 | Anderson et al. | 257/288 |
| 8,383,503 B2 | 2/2013 | Johnson | 438/595 |
| 8,384,142 B2 | 2/2013 | Juengling | 257/302 |
| 8,642,424 B2 | 2/2014 | Jain et al. | 438/259 |
| 2009/0309162 A1 | 12/2009 | Baumgartner et al. | 257/368 |
| 2010/0044762 A1 | 2/2010 | Orlowski | 257/288 |
| 2011/0024794 A1 | 2/2011 | Ko et al. | 257/190 |
| 2011/0260257 A1* | 10/2011 | Jagannathan et al. | 257/369 |
| 2012/0104538 A1 | 5/2012 | Anderson et al. | 257/506 |
| 2012/0156838 A1 | 6/2012 | Anderson et al. | 438/217 |
| 2012/0273895 A1 | 11/2012 | Anderson et al. | 257/369 |
| 2012/0319178 A1 | 12/2012 | Chang et al. | 257/287 |
| 2013/0015515 A1 | 1/2013 | Anderson et al. | 257/302 |
| 2013/0026465 A1* | 1/2013 | Chang et al. | 257/48 |
| 2013/0049136 A1 | 2/2013 | Wahl et al. | 257/401 |
| 2013/0057622 A1* | 3/2013 | Govyadinov et al. | 347/85 |
| 2013/0241007 A1* | 9/2013 | Choi et al. | 257/410 |

OTHER PUBLICATIONS

R. Courtland, "Foundries Rush 3-D Transistors." Foundries Rush 3-D Transistors—IEEE Spectrum, Jan. 2013, http://spectrum.ieee.org/semiconductors/devices/foundries-rush-3d-transistors.

D. James, "Intel Details 22nm Trigate SoC Process at IEDM." Chipworks, Technology Blog 2012 http://www.chipworks.com/blog/technologyblog/2012/12/20/inteldetails-22nm-trigate-soc-process.

D. Johnson, "Now that 3D Chips Are Here, What Does the Next Generation Hold?" IEEE Spectrum, Nov. 18, 2011, http://spectrum.ieee.org/nanoclast/semiconductors/nanotechnology/now-that-3d-chips-are-here-what-does-the-next-generation-hold.

J. Kawa, et al., "FinFET: The Promises and the Challenges." Synopsys Insight Newsletter, Issue 3, 2012, http://www.synopsys.com/Company/Publications/SynopsysInsight/Pages/Art2-finfet-challenges.

M. Smith, "Samsung Reveals Its First 14nm FinFET Test Chip, Should Offer Substantial Power Improvements in Future Silicon." Engadget, Dec. 21, 2012, http://www.engadget.com/2012/12/21/samsung-first-14nm-finfet-test-chip-/.

Ying-Ying Zhang, et al., "Influence ofan Oxide Interlayer Dielectric (ILD) Capping Layer on the Thermal Stability of Ni Germanide for Nanoscale Ge MOSFETs." Journal of the Korean Physical Society, vol. 55, No. 3, Sep. 2009, pp. 1026-1030.

"Intel Clarifies 32-nm NMOS Stress Mechanism at IEDM 2011." Chipworks, Technology Blog, 2011 http://www.chipworks.com/blog/technologyblog/2011/11/21/umcgoes-gate-last-and-intel-challenges.

International Search Report of corresponding PCT Application Serial No. PCT/US2014/000024.

* cited by examiner

METAL GATE STRUCTURES FOR FIELD EFFECT TRANSISTORS AND METHOD OF FABRICATION

BACKGROUND

1. Field

Field effect transistor technology which may be in the form of a 3D gate (FinFET) or a planar gate MOSFET.

2. Description of the Background Art

This section describes background subject matter related to the disclosed embodiments of the present invention. There is no intention, either express or implied, that the background art discussed in this section legally constitutes prior art.

The semiconductor industry is poised to make general use of 3D FinFET gate structures and various planar MOSFET gate structures during the coming years. There is a need to develop FET gate structures which can meet the new size node in semiconductor manufacturing, which will be in the range of 10-15 nm. Because FET structures generates significant electrical effects on neighboring structures, and the spacing between the structures is decreasing, there is a need to improve the metal gate structures in a manner which better controls electrical effects while maintaining good conductivity. To provide a starting background against which the present, inventive technology may be better understood, applicants want to describe at least a portion of the published art which is related to applicants' improved metal-comprising gate structures, and a fabrication method which is useful in making the improved metal-comprising gate structures.

U.S. Pat. No. 7,105,934 to Anderson et al., issued Sep. 12, 2006, entitled: "FinFET With Low Gate Capacitance And Low Extrinsic Resistance" describes a Fin FET device designed to lower gate capacitance and extrinsic resistance in a field effect transistor. The method of forming the structure comprises forming an isolation layer comprising a BOX layer over a substrate, configuring source/drain regions above the isolation layer, forming a fin electrode adjacent to the fin structure, disposing a gate insulator between the first gate electrode and the fin structure, positioning a second gate electrode transverse to the first gate electrode, and depositing a third gate electrode on the fin structure, the first gate electrode and the second gate electrode. (Abstract)

U.S. Pat. No. 7,396,710 to Okuno, issued Jul. 8, 2008, entitled: "Fin-type Semiconductor Device With Low Contact Resistance And Its Manufacture Method" describes a fin-type semiconductor device which is said to have low contact resistance. The semiconductor device comprises a fin-type semiconductor region (fin) on a support substrate, where the fin has a pair of generally vertical side walls and an upper surface coupling the side walls. An insulated gate electrode structure traverses an intermediate portion of the fin, and has side walls in conformity with the side walls of the fin. (Abstract)

A U.S. Patent Application Publication of Baumgartner et al., Pub. No.: US 2009/0309162, published Dec. 17, 2009, and entitled: "Semiconductor Device Having Different Fin Widths", describes a similar structure. The device includes at least one source region and at least one drain region. A plurality of fins extend between a source region and a drain region, wherein at least one fin has a different width than another fin. At least one gate is provided to control current flow through such fins. Fin spacing may be varied in addition to, or alternative to utilizing different fin widths. (Abstract)

A U.S. Patent Application Publication of Jagannathan et al., Pub. No. 2011/0260257, published Oct. 27, 2011, and entitled: "High Performance Non-Planar Semiconductor Devices With Metal Filled Inter-Fin Gaps" describes a non-planar semiconductor transistor device which includes a substrate layer. Conductive channels extend between corresponding source and drain electrodes. A gate stack extending in a direction perpendicular to the conductive channels crosses over the plurality of conductive channels. The gate stack includes a dielectric layer running along the substrate and the plurality of conductive channels and arranged with a substantially uniform layer thickness. A metal layer, distinct from the work-function electrode layer, covers the work function electrode layer and is arranged with a substantially uniform height with respect to the substrate, such that the metal layer fills a gap between proximate conductive channels of the plurality of conductive channels. (Abstract)

U.S. Patent Application Publication of Chang et al., Pub. No. 2012/0319178, published Dec. 20, 2012, and entitled: "Double Gate Planar Field Effect Transistors" describes a stacked planar device and a method of forming the same. The method includes forming, on a substrate a stack of layers having alternating sacrificial and channel layers, patterning the stack such that sides of the stack include exposed surfaces of the sacrificial and channel layers, forming a dummy gate structure over a region of the stack to establish a planar area, forming a dielectric layer around the dummy gate structure to cover areas adjacent to the planar area, removing the dummy gate structure to expose the stack, selectively etching the stack to remove the sacrificial layers from the channel layers in the planar area, and forming a gate conductor over and in between the channel layers to form a transistor device. (Abstract)

U.S. Patent Application Publication of Wahl et al., Pub. No. 2013/0049136, published Feb. 28, 2013, and entitled: "Combined Planar FET and FIN-FET Devices and Methods" describes electronic devices having advantageous design flexibility that avoid channel-width quantization effects common with prior art fin-type (FIN) field effect transistors (FIN-FETS). The devices are said to be obtained by providing multiple FIN-FETs and at least one planar FET on a common substrate. (Abstract)

In a paper titled: "A 22 nm High Performance and Low-Power CMOS Technology Featuring Fully-Depleted Tri-Gate Transistors, Self-Aligned Contacts & High Density MIM Capacitors", presented in the 2012 Symposium on VLSI Technology Digest of Technical Papers, 978-1-4673-0847-2/12 IEEE, there is a description of upcoming 22 nm logic technology. (Abstract).

While the technology discussed above has been established to work for the 22 nm node process, the next progression to a 15 nm node and further to the 11 nm node requires a change in materials and fabrication processes to accommodate the smaller size requirements while still meeting performance requirements. Requirements which must be met include trench opening size of less than 10 nm. Fin plus gate height for fill needs to be about 100 nm. This means the metal-comprising gate fill materials and processes must be applicable to a high aspect ratio trench which has an opening size in the range of 10 nm. Further, the conductivity of the gate must be maintained at a feature size of less than 10 nm. Finally, the new materials and processes must have a minimal impact on device variability. Applicants developed a significant amount of data related to resistivity of various materials as the critical dimension of a trench to be metal filled decreases from 22 nm, approaching zero. The data indicates that as the critical dimension of the metal-filled trench becomes smaller, the resistivity of a filled metal-comprising gate tends to increase exponentially. This is a serious problem which needs to be solved by a combination of specialty materials and particular fabrication techniques. The present invention relates to the solution of this problem for filled metal-comprising gates needed for the 15 nm or lower semiconductor device manufacturing node.

SUMMARY

Embodiments of the present invention relate to combinations of materials and fabrication techniques which permit the fabrication of filled, metal-comprising gates for use in planar and 3D MOSFET gate structures. A first portion of the embodiments relate to gate structures of the kind needed for improved performance in functioning semiconductor structures at the 15-10 nm semiconductor manufacturing node, for example. A second portion of the embodiments relate to larger gate structures where there are more options available for modification of the overall structure.

The embodiments provide several variations in structure and materials. Typically a change in the overall features of the structure, or in the materials used to form the structures, requires that a different series of process steps be used to apply the materials. The differences in crystalline structure and physical properties of the various materials, as well as the spacial requirements for formation of structural features of filled metal-comprising gates must be considered. The processing techniques discussed for application and removal of materials during fabrication of semiconductor structures, such as ALD, CVD, PVD, reflow, and RIE are generally known in the art. The present invention lies in the use of a particular combination of processing steps performed in a specific order; and, the selection of particular combinations of materials which are applied within the processing steps, so that the resulting semiconductor structure formed is as required to provide the performance advantages described herein.

Determination of the combination of materials and processing steps which will perform at a manufacturing node of 15 nm or less has required the development of empirical data on a large scale. We have developed some very advantageous combinations of materials and processes which provide filled, metal-comprising gate structures for field effect transistors (FETs) at the 15 nm or lower semiconductor manufacturing node.

As the MOSFET gate scaling continues, metal gate conductivity is continuously decreasing. Some of the metal-based materials previously used cannot provide adequate conductivity at the 15 nm or lower gate trench width. We have developed new metal and metal alloy compositions which improve conductivity. Our supporting data illustrating various metal and metal alloy conductive line materials is shown in the form of conductivity versus metal line trench width in FIGS. 9A through 9C.

A number of gate structures are described below, to illustrate the most advantageous combination of materials and processes which provide particular filled, metal-comprising FET gate structures. A portion of the structures illustrated have been established to be obtainable for a 15 nm manufacturing node using structure mimicking device data. Each of the gate structures is described with reference to representative figures, since this enables a better understanding of the combination of materials and processes which are required for formation of the structure. While many of the structures are similar, the combination of alternative materials and varying processing conditions produces a new performance result. The fabrication processes described are for use in scaled MOSFET structures including both planar and 3D FET, and provide improved performance and processing compatibility for various channel lengths.

In one embodiment related to smaller gate structures, a portion of a conformal diffusion barrier/work function (DB/WF) layer is etched back to create an area near the upper surface of the filled, metal-comprising gate structure which is then filled with a more conductive metal, so that the overall conductivity of the gate structure is improved. In another embodiment related to larger gate structures, a portion of a conformal metal-comprising conductive layer, which is formed from a diffusion barrier/work function (DB/WF) metal, is selectively etched back without affecting an adjacent, highly conductive gap fill metal portion of the filled, metal-comprising gate structure. The etched back portion of the DB/WF metal layer provides a space which is then filled with a higher conductivity metal, improving the overall conductivity of the gate structure.

We have developed a filled, metal-comprising gate formation process in which gate trench sections are lined with a high k dielectric layer, followed by at least one metal layer deposition. Typically, the metal layer deposition(s) are followed by a chemical mechanical polishing (CMP) step, to remove metal extending above the maximum height of the dielectric liner layer. Subsequently, an etch back process is used to selectively or non-selectively remove an upper portion of the metal fill which comprises a lower conductivity DB/WF metal, for example. The space created by the etch back process is filled with a metal or metal alloy of a higher conductivity. In some instances multiple layers of conductive metals are deposited and a reflow is carried out which converts a portion adjacent metal layers into an alloy.

In another embodiment, where the overall gate conductivity is acceptable, and a main concern is a possibility of contact misalignment, the etched back sections described above may be filled with a dielectric film which acts as a self-aligned contact etch stop layer.

The series of process steps used work well for different channel lengths (short and long). Long channel and short channel conductivity for FETs may be maximized for an entire substrate, containing multiples of varying chips. Previously known technology is not applicable for simultaneous processing of a wide range of channel lengths.

BRIEF DESCRIPTION OF THE DRAWINGS

With reference to FIG. 1A, the filled, metal-comprising gate 101 includes a horizontal section 109 which is in direct communication with the upper surface 103 of conductive Fin 102, and vertical sections 108 which are in direct contact with sidewalls 105 of Fin 102. The exterior surfaces of Fin 102 are typically covered by a thin film of a high k dielectric (not shown).

DETAILED DESCRIPTION OF EXEMPLARY EMBODIMENTS

As a preface to the detailed description, it should be noted that, as used in this specification and the appended claims, the singular forms "a", "an", and "the" include plural referents, unless the context clearly dictates otherwise.

When the word "about" is used herein, this is intended to mean that the nominal value presented is precise within ±10%.

Embodiments of the present invention relate to combinations of materials and fabrication techniques which permit the fabrication of filled, metal-comprising gates for use in planar and 3D MOSFET gate structures. A first portion of the embodiments relate to gate structures of the kind needed for improved performance in functioning semiconductor structures at the 15-10 nm semiconductor manufacturing node, for example. A second portion of the embodiments relate to larger gate structures where there are more options available for modification of the overall structure.

The embodiments provide several variations in structure and materials. Typically a change in the overall features of the structure, or in the materials used to form the structures, requires that a different series of process steps be used to apply the materials. The processing techniques discussed for application and removal of materials during fabrication of semiconductor structures, such as ALD, CVD, PVD, reflow, and RIE are generally known in the art. The present invention lies in the use of a particular combination of processing steps performed in a specific order; and, the selection of particular combinations of materials which are applied within the processing steps, so that the resulting semiconductor structure formed is as required to provide the performance advantages described.

A number of gate structures are described below, to illustrate the most advantageous combination of materials and processes which provide particular filled, metal-comprising FET gate structures. A portion of the structures illustrated have been established to be obtainable for a 15 nm manufacturing node using structure mimicking device data. Each of the gate structures is described with reference to representative figures, since this enables a better understanding of the combination of materials and processes which are required for formation of the structure. While many of the structures are similar, the combination of alternative materials and varying processing conditions produces a new performance result. The fabrication processes described are for use in scaled MOSFET structures including both planar and 3D FET, and provide improved performance and processing compatibility for various channel lengths.

Described below is a filled, metal-comprising gate formation process in which gate trench sections are lined with a high k dielectric layer, followed by at least one metal layer deposition. Typically, the metal layer deposition(s) are followed by a chemical mechanical polishing (CMP) step, to remove metal extending above the maximum height of the dielectric liner layer. Subsequently, an etch back process is used to selectively or non-selectively remove an upper portion of the metal fill which comprises a lower conductivity DB/WF metal, for example. The space created by the etch back process is filled with a metal or metal alloy of a higher conductivity. In some instances multiple layers of conductive metals are deposited and a reflow is carried out which converts a portion adjacent metal layers into an alloy.

Also described below is another embodiment, where the overall gate conductivity is acceptable, and a main concern is a possibility of contact misalignment, the etched back sections described above may be filled with a dielectric film which acts as a self-aligned contact etch stop layer.

Figure 1A:
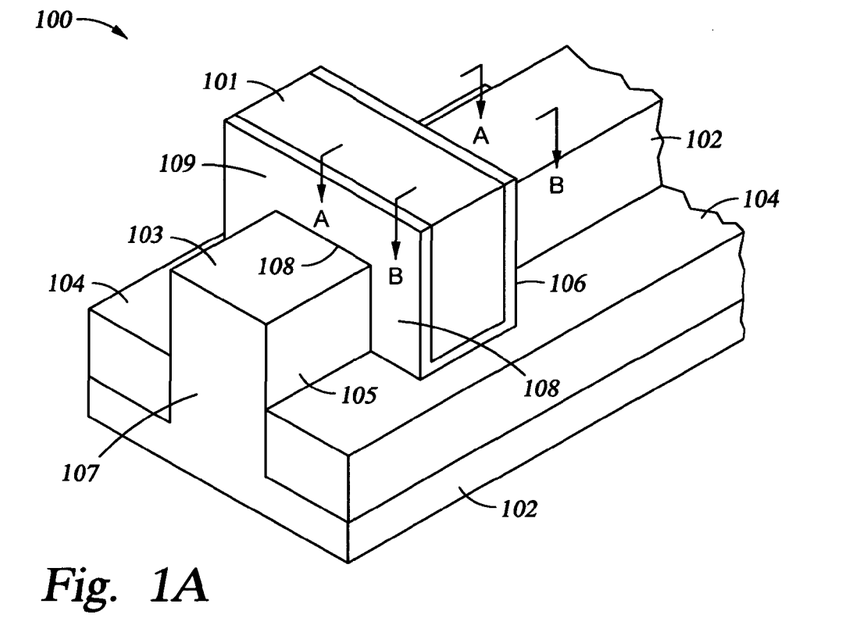
FIG. 1A shows an exemplary FinFET structure comprising a gate 101. The gate is a filled, metal-comprising gate. Variations on the filled, metal-comprising FinFET gate structure, are described for a number of different embodiments herein.

FIG. 1A shows a FinFET structure 100 which includes a filled metal-comprising gate structure 101 of the kind which may be fabricated using any one of the combination of materials and process steps which are described and claimed herein. The semiconductor Fin 102 and the STI oxide 104 are generally known in the art.

Figure 1B:
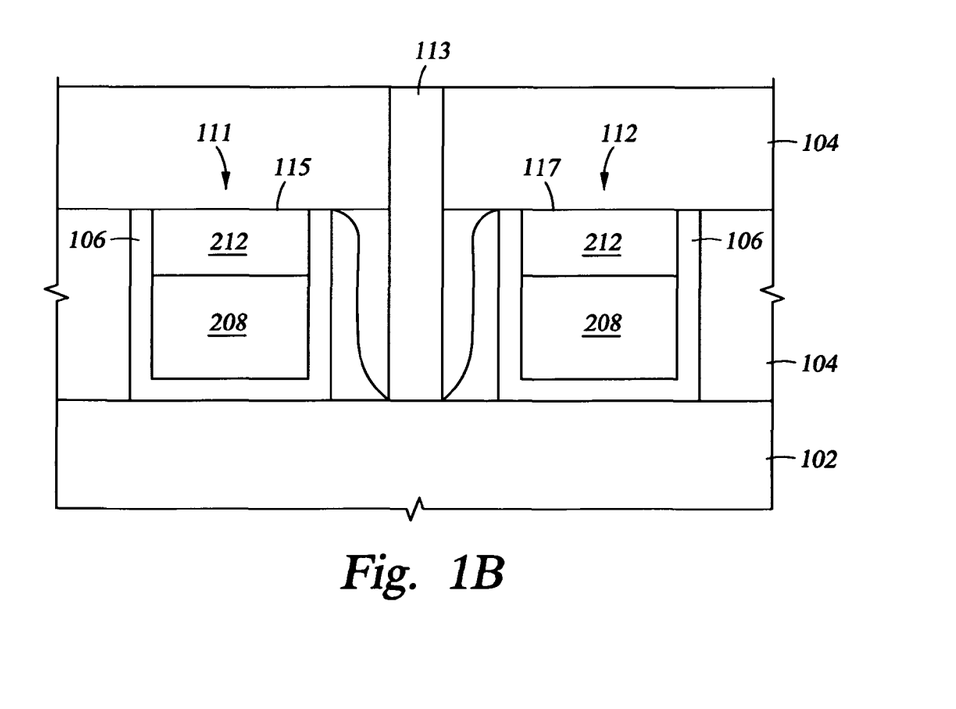
FIG. 1B shows an exemplary planar FET structure comprising a first metal gate section 111, and a second metal gate section 112, with a contact 113 between the first and second metal gates. A layer of oxide 104 overlies the upper surface 115 of first metal gate 111 and the upper surface 117 of second metal gate 112.

With reference to FIG. 1A, a FinFET gate structure, the horizontal section 109 of gate structure 101 and the vertical sections 108 of the gate structure 101 are formed so that they are in direct contact with the surfaces of the conductive Fin structure 102. The first layer of the gate structure, which is formed in direct contact with surfaces of the Fin structure 102 and in direct contact with an STI oxide layer 104 is referred to as a liner layer 106. The liner layer 106, a common feature of all of the filled, metal-comprising gate structures is described herein. The liner layer is illustrated in the cross-sectional view of a planar FET which is shown in FIG. 1B. The liner layer is also shown in Figure sets 2-8. The liner layer 106 typically comprises a high-k dielectric fabricated using an ALD or CVD deposition process which forms a conformal layer having a thickness in the range of about 1 nm to about 3 nm. High-k liner layer 106 comprises a material selected from the group consisting of hafnium oxide, hafnium oxide silicate, hafnium nitride, Zr-doped hafnium oxide, and combinations thereof, by way of example and not by way of limitation. The liner layer is deposited over the surface of Fin 102 (where there is typically an oxide layer on the surface of the Fin) and over STI oxide layer 104 in FIG. 1A.

Following deposition of the liner layer 106, a metal-comprising layer which acts as a diffusion barrier layer and a work function metal-containing combined layer combined (DB/WF layer) 208, which has an electrical conductivity selected based on desired device function, is applied over liner layer 106. DB/WF layer 208 is typically applied using a method which applies a conformal layer, such as atomic layer deposition (ALD) or chemical vapor deposition (CVD), where the material deposited is selected from the group consisting of TiN, TiAl, TaAl, TiAlC, WSi, WN, and combinations thereof.

After deposition of liner layer 106 and DB/WF layer 208, the materials and processing which are subsequently applied are varied depending on the filled, metal-comprising gate structure which is most beneficial to a particular application. Figure sets 2 through 8 represent embodiment gate structures which may be fabricated. It is understood that with respect to gate fill applications, when it is desired to control the thickness of an individual layer which has been applied, and that surface rises above the surface of DB/WF layer 208, chemical mechanical polishing (CMP) may be used for this purpose.

FIG. 1B represents a planar FET transistor structure of a kind known in the semiconductor industry. (The structure includes a silicon substrate 102, two gate sections, 111 and 112, each of which is adjacent to, but electrically separated from contact 113.) Filled metal-comprising gate sections 111 and 112 each include a high k dielectric layer 106, and a metal fill layer 208 with an overlying more conductive metal fill 212. The higher conductivity metal fill 212 is present at the upper surface 115 of gate section 111 and the upper surface 117 of gate section 112. An overlying insulating dielectric layer 104 is in contact with both the electrical contact 113 and both gate sections 111 and 112. The materials used to form the filled, metal-comprising gate sections are the same as those described with respect to FIG. 1A.

FIGS. 2A-2H show a set of processing steps which make up a first embodiment fabrication process. FIGS. 2A-2D represent process steps used to fabricate a small CD filled, metal comprising gate structures (typically having a CD of 15 nm or smaller). A MOSFET gate trench 203 having a liner layer 206 of a high-k dielectric layer is typically formed from hafnium oxide. A conformal metal-comprising layer 208 (which becomes a metal fill when the CD is as small as 15 nm or less) is applied over the liner layer 206. The conformal metal comprising layer material is typically applied by ALD or CVD, and is selected from the group consisting of TiN, TiSiN, TaN, TiAl, TiAlC, TaAlC, WSi, WN, TaAlSi, TaN, TaC, HfC and combinations thereof, depending on the desired performance characteristics for the functional device which will make use of the gate structure.

Figure 2A:
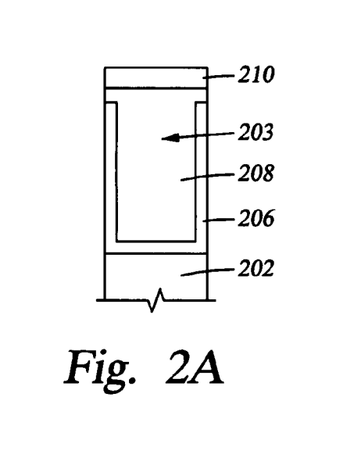
FIGS. 2A through 2D illustrate a first series of process steps for fabrication of a first embodiment gate structure where the gate size is designed for a manufacturing node of 15 nm or lower, and where there are multiple sized gates processed simultaneously on a common substrate.
Figure 2B:
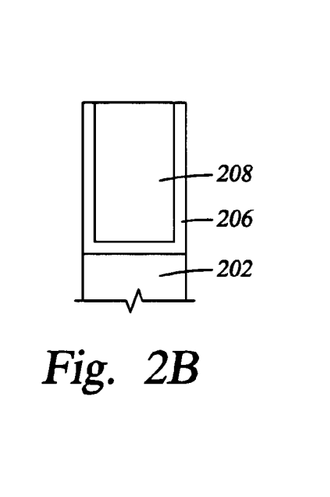
Figure 2C:
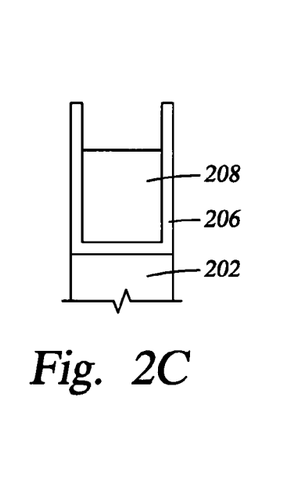
Figure 2D:
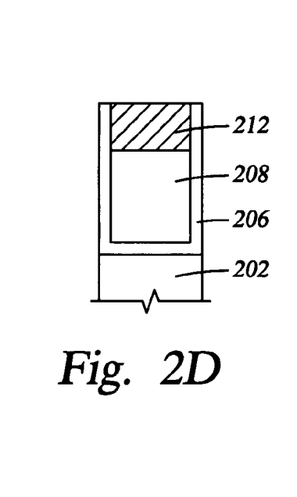
Figure 2E:
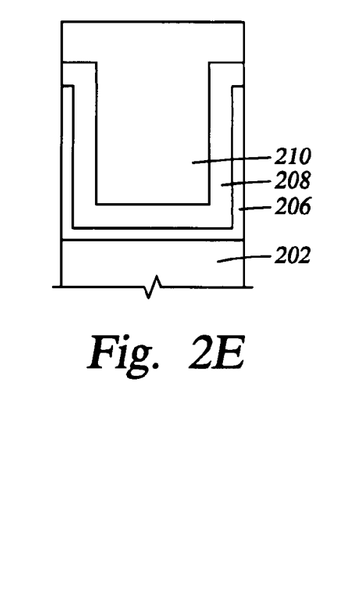
FIGS. 2E through 2H illustrate the fabrication of a larger gate structure, having a gate size designed for a manufacturing node of larger than 15 nm. The larger gate structure is present on the same substrate as the gate structure illustrated in FIGS. 2A through 2D. The processing is simultaneous and the same process steps are discussed with reference to FIGS. 2E through 2H.

FIGS. 2E-2H show a set of processing steps which are used for fabrication of larger CD filled, metal-comprising gate structure, for example a CD which is larger than 15 nm and may be 60 nm or larger, by way of example and not by way of limitation. The processing steps for this gate structure are the same as those described above for FIGS. 2A-2D, followed by additional steps, where a layer 210, referred to herein as a gap fill metal is applied over the conformal metal comprising layer 208 using an application such as CVD or PVD, depending on the surfaces which are to be covered. In FIG. 2E, the gap fill metal 210 is typically applied using a CVD or PVD process. The gap fill metal is typically selected from a Ti liner with Al fill, a Co liner with Al fill, Al, Ti—Al, Co—Al, W, or combinations thereof, by way of example and not by way of limitation. After application, the metal(s) deposited are typically reflowed.

Figure 2F:
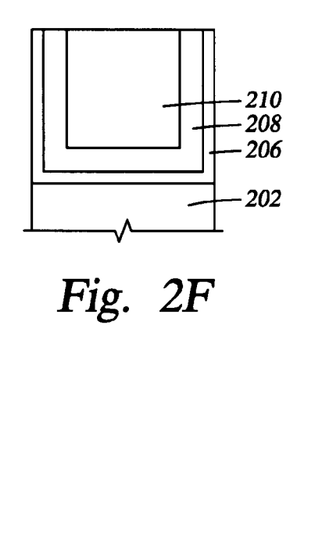
Figure 2G:
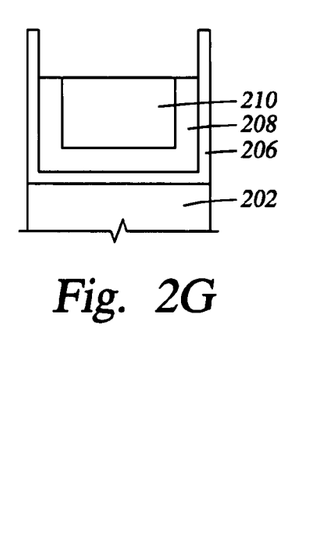

As indicated in FIG. 2F, CMP is generally used to remove excess material from the surface of the structure illustrated in FIG. 2E. This provides for a cleaner process and a more uniform upper surface after the etch back process, the result of which is shown in FIG. 2G. The etch back process is a non-selective etch back process which removes both the conformal layer of metal 208, and the CVD or PVD reflow deposited layer of gap fill metal present as fill, as illustrated in FIG. 2F. The depth of etch is typically about 20% to 30% of the gate height, depending on the application. When there are both small gate features (15 nm or less CD) as shown in FIG. 2B and large gate features (larger than 15 nm CD) as shown in FIG. 2F on the substrate surface which is being processed, both features are etched to approximately the same depth, depending on the composition of the DB/WF layer 208 and the composition of the gap fill layer 210, as well as the performance characteristics desired for the gate structures. The small and large gate structures after the etch back process are shown in FIGS. 2C and 2G, respectively. The RIE etchant chemistry used for the etch back process is $Cl_2$ or $BCl_3$, by way of example to etch TiAl or TiN; and $SF_6$ or $NF_3$ to etch Wn or WSi, by way of example.

Figure 2H:
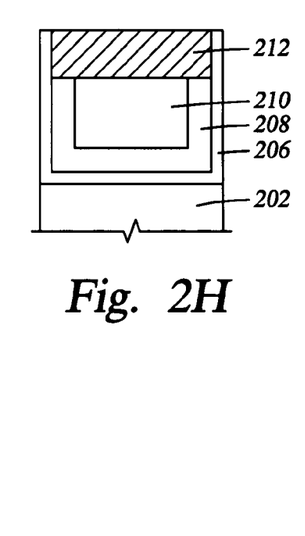

Subsequently, to improve the conductivity of the gate, for either the small gate feature illustrated in FIG. 2D or for the large gate feature illustrated in FIG. 2H, a highly conductive metal selected from the group consisting of Al, W, Co, or combinations thereof is deposited by CVD or PVD, depending on the gate feature size.

FIGS. 3A-3H show a set of processing steps which make up a second embodiment fabrication process. FIGS. 3A-3D show a set of processing steps which are used for fabrication of small CD filled, metal comprising gate structures (typically having a CD of 15 nm or smaller). A MOSFET gate trench 303 is formed, having a liner layer 306 of a high-k dielectric layer selected from the group consisting of $HfO_2$, HfSiO, HfSiON, Hf(M)Ox and combinations thereof, by way of example. A conformal metal-comprising layer 308 (which becomes a metal fill when the CD is as small as 15 nm or less) is applied over the liner layer 306. The conformal metal comprising layer material is typically applied by ALD or CVD, and is selected from the group consisting of TiN, TiAl, TaAl, TiAlC, TaAlC, WSi, WN TaAlSi, TaN, TaC, HfC, and combinations thereof, depending on the desired performance characteristics for the functional device which will make use of the gate structure.

Figure 3A:
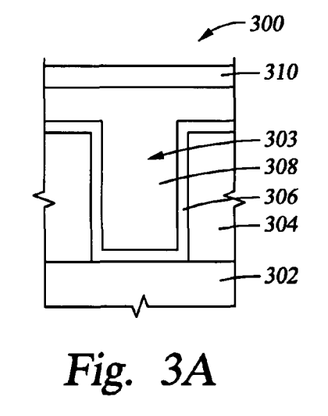
FIGS. 3A through 3D illustrate a second series of process steps for fabrication of a second embodiment gate structure where the gate size is designed for a manufacturing node of 15 nm or lower, and where there are multiple sized gates processed simultaneously on a common substrate.
Figure 3B:
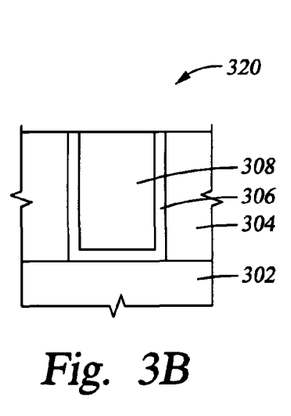
Figure 3C:
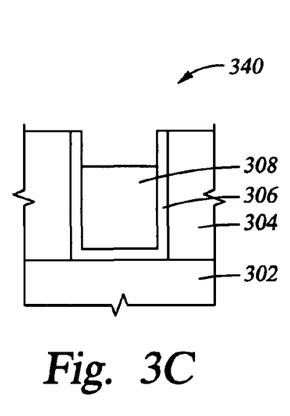
Figure 3D:
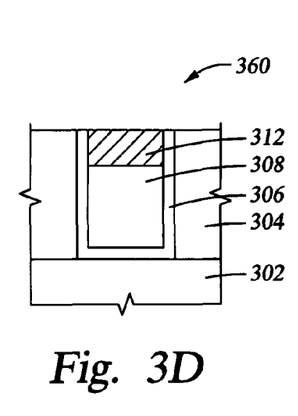
Figure 3E:
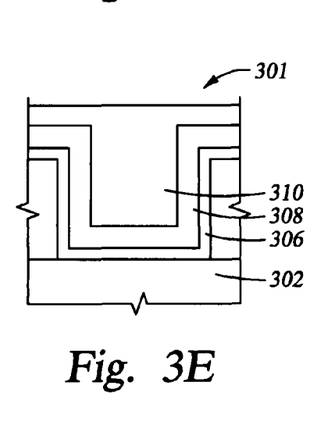
FIGS. 3E through 3H illustrate the fabrication of the larger gate structure designed for a manufacturing node of larger than 15 nm. The larger gate structure is present on the same substrate as the gate structure illustrated in FIGS. 3A through 3D. The processing is simultaneous and the same process steps are discussed with reference to FIGS. 3E through 3H.

FIGS. 3E-3H represent the fabrication of the larger CD filled, metal-comprising gate structures, which are formed simultaneously on the same substrate as the smaller CD gate structures. The gap fill metal which does not deposit on the interior of the smaller CD gate structures (which are filled with the conformal metal described above) does deposit on the interior of the larger CD structures. The gap fill metal is typically selected from W, Co, Ti—Al, Co—Al, and combinations thereof, by way of example and not by way of limitation, and is applied using CVD or PVD, depending on the surfaces which are to be covered. In FIG. 3E, the gap fill metal 310 is applied using a CVD process. After application, the metal(s) deposited are typically reflowed to provide for a good fill.

Figure 3F:
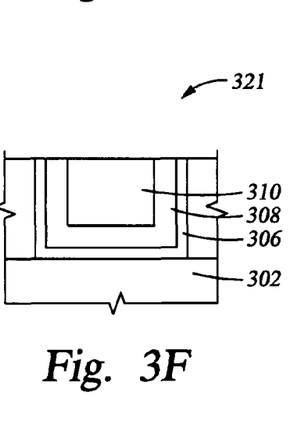
Figure 3G:
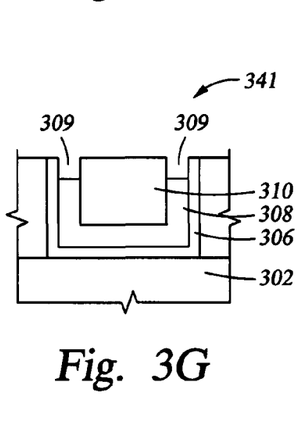

As indicated in FIG. 3F, CMP is generally used to remove excess material from the surface of the structure illustrated in FIG. 3E. This provides a cleaner etch back process and a more uniform upper surface after the etch back process. In this embodiment, the etch back process is a selective etch back process which removes the conformal layer of metal 308, without affecting the gap fill metal 310. This is illustrated in FIG. 3G which represents the large feature CD where the exterior layer of conformal metal 308 is removed, but the gap fill metal layer 310 is not removed. Further, since the conformal layer of metal 308 is present in the central portion of the small feature CD, this metal is removed in the etch back process to form the structure shown in FIG. 3C. The depth of etch within both the large and small feature CDs is about 20% to about 30% of the trench depth (or gate height), as previously discussed, depending on the application for the gate structure. The RIE etch back process is as follows. $Cl_2$ or $BCl_3$, by way of example, is typically used to etch TiN without disturbing W; $SF_6$ or $NF_3$, by way of example, is typically used to etch WN without disturbing Al. Cl or F based RIE, by way of example, is typically used to etch TiN, TiAl, or W without disturbing Co. It is also possible to use a wet etch, such as an Ammonia Peroxide Mixture ($NH_4+H_2O_2+H_2O$), also referred to as "SC1", to etch TiN, Ti, Al and W without disturbing Co.

Figure 3H:
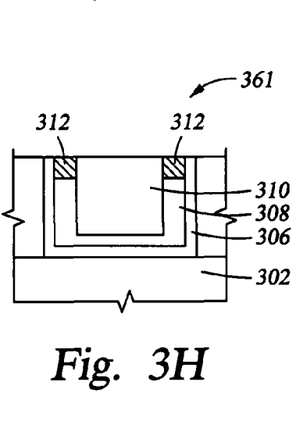

Subsequently, the space created by the partial depth removal of conformal layer 308 is filled with a highly conductive metal using CVD or PVD of Al, W, Co, and combinations thereof with reflow, to provide the structures shown in FIGS. 3D (small gate feature) and 3H (large gate feature).

Figure 4:
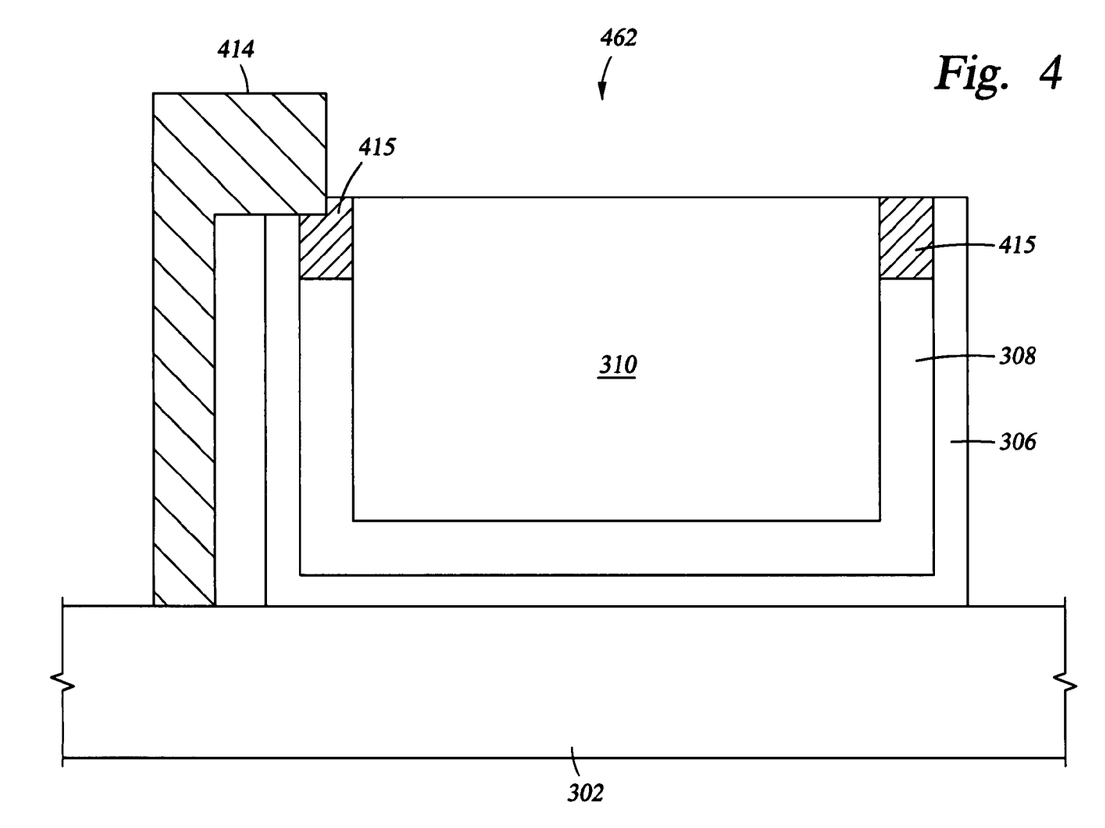
FIG. 4 shows an enlargement 462 of the second embodiment gate structure shown in FIG. 3H, where rather than a conductive layer 312, a dielectric layer 415 is applied in the space created by the etchback of layer 308. Deposition of such a dielectric layer is helpful when there is a possibility, due to the electronic device design, that a contact 314 formed as part of the device structure might not land at the correct location on substrate 302.

FIG. 4 illustrates an alternative embodiment to the metal fill of the etched back space created using the process described with respect to FIGS. 3A-3D and 3E-3H. This alternative provides a third embodiment fabrication process. For substrates which contain planar FETs of the kind shown in FIG. 1B, whether the gate channel size is the large or small, there is a danger that the contact structure 113 may not be landed in the desired position between the gates 111 and 112 (due to contact size, shape, or registration difficulties during processing). To protect against short circuiting between a contact 414 which has been improperly landed, the space created by the partial depth removal of conformal layer 308 (not shown) may be filled with a dielectric film 415 which operates as a self-aligned contact etch stop layer around the outer edge of the highly conductive metal fill layer. Examples of dielectric film materials are SiN, SiON, SiCN, and combinations thereof, by way of example. Since the gap fill metal 310 area is sufficiently large for the large gate channel, as illustrated in FIG. 4, the overall conductance of the gate will not be adversely affected.

A second CMP is used to polish either the last metal fill (e.g. Al or W) or to polish the etch stop dielectric film (eg. SiN, SiON, SiCn).

The above described structure and process for making it provide a number of benefits for the gate structures produced. The process works well for different channel lengths. Long channel conductivity is retained even while enabling self-aligned contact etch stop (typically SiN) along the edge of the large gate structure.

FIGS. 5A-5F illustrate a set of processing steps which make up a fourth embodiment fabrication process. Steps 5A-5C are used for fabrication of small CD filled, metal comprising gate structures (typically having a CD of 15 nm or smaller). A MOSFET gate trench 503 having a layer 506 of a high-k dielectric layer of the kind previously described herein is formed. A conformal metal-comprising layer 508 (which becomes a metal fill when the CD is as small as 15 nm or less) is applied over the liner layer 506. The conformal metal comprising layer material is typically applied by ALD or CVD, and is selected from the group consisting of TiN, TiSiN, TaN, TiAl, TiAlC, TaAlC, WSi, WN TaN, TaC, HfC, and combinations thereof, depending on the desired performance characteristics for the functional device which will make use of the gate structure.

Figure 5A:
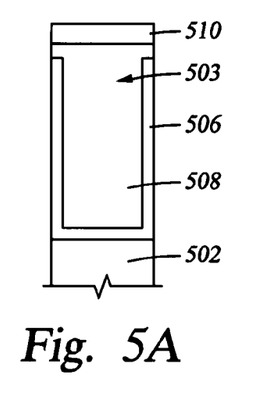
FIGS. 5A through 5C illustrate a third series of process steps for fabrication of a third embodiment gate structure where the gate size is designed for a manufacturing node of 15 nm or lower, and where there are multiple sized gates processed simultaneously on a common substrate.
Figure 5B:
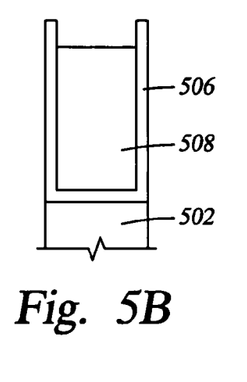
Figure 5C:
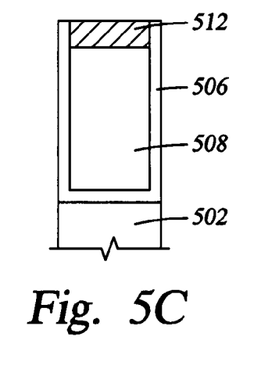
Figure 5D:
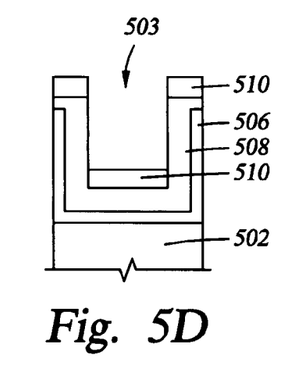
FIGS. 5D through 5F illustrate the fabrication of the larger gate structure designed for a manufacturing node of larger than 15 nm. The larger gate structure is present on the same substrate as the gate structure illustrated in FIGS. 5A through 5C. The processing is simultaneous and the same process steps are discussed with reference to FIGS. 5D through 5F.
Figure 5E:
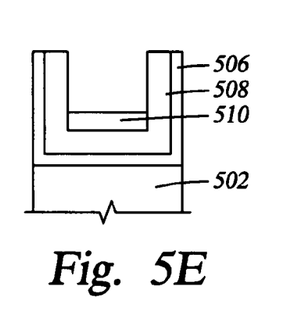
Figure 5F:
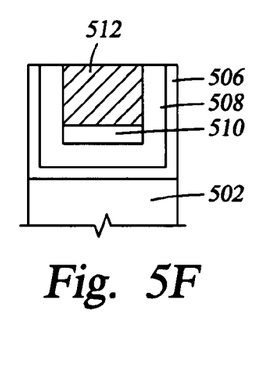

FIGS. 5D-5F show a set of processing steps which are used for fabrication of larger CD filled, metal-comprising gate structure, for example a CD which is larger than 15 nm and may larger than 60 nm, by way of example and not by way of limitation. The fabrication steps for this gate structure are the same as those described above for FIGS. 5A-5C, followed by additional steps which provide a thicker layer of a DB/WF material at the bottom of trench 503, which helps protect underlying layers during an etch back process.

A second layer of the same material as that which was applied as layer 508 is applied using PVD to form an additional layer 510 at the bottom of trench 503. This is a targeted PVD deposition, as the ALD or CVD conformal layer 508 filled the small gate feature, as shown in FIG. 5A. Subsequently, an optional CVD may be used to remove excess metal-containing material which is present on surfaces above the liner layer 506 (not shown). This provides a cleaner process and a more uniform upper surface after the etch back process, the result of which is shown in FIGS. 5B and 5E.

The etch back process is carried out using RIE processing which makes use of $Cl_2$ or $BCl_3$, by way of example to etch TiAl or TiN; and $SF_6$ or $NF_3$ to etch Wn or WSi, by way of example. The etch back process is anisotropic and etches back a portion of the conformal fill layer 508 present in the upper area of the small gate feature as shown in FIG. 5B, and a portion of the PVD deposited layer 510 present at the bottom of the trench, as illustrated in FIG. 5E.

Subsequently, a highly conductive metal 512 is applied by CVD or PVD to the etched back areas to form a more conductive gate structure which is illustrated in FIGS. 5C and 5F. The highly conductive metal is typically Al, W, Co or combinations thereof.

FIGS. 6A-6H illustrate a set of processing steps where all metal fill materials which are applied after the first conformal layer of DB/WF material are applied using PVD. The PVD is targeted toward the long channel gates only, as the short channel gates are completely filled by the first conformal layer. For example, PVD of TiAl as a WF layer, or a PVD Ti liner with Al fill, reflowed, or Ti Al/Ti liner/Al all work well to form a protective layers at the bottom of a trench during an etch back step.

FIGS. 6A-6H show a set of processing steps which are used for simultaneous fabrication of short channel and long channel gates on a single substrate. The small channel gate structures typically have a trench CD of 15 nm or smaller. The large channel gate structures typically have a trench CD ranging from larger than 15 nm up to about 60 nm.

Figure 6A:
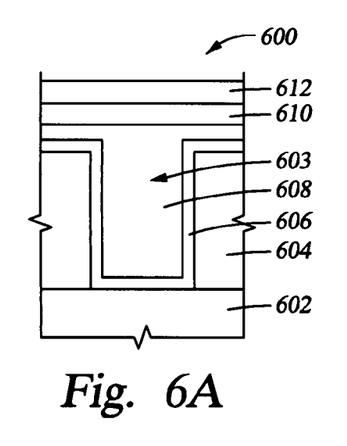
FIGS. 6A through 6D illustrate a fourth series of process steps for fabrication of a fourth embodiment gate structure where the gate size is designed for a manufacturing node of 15 nm or lower, and where there are multiple sized gates processed simultaneously on a common substrate.

The trench liner of high k dielectric previously described herein is present as a liner layer in all of the gate trenches. The thickness of the high k dielectric layer 606 is about 2 nm. A layer of a DB/WF material 608, selected from TiN, TiAl, TaAl, TiAlC, TaAlC, WSi, WN and combinations thereof is applied conformally using ALD or CVD to produce a DB/WF layer which is about 4 nm thick. The DB/WF layer 608 completely fills the short channel gate trench, as shown in FIG. 6A, due to the CD of the trench.

Figure 6B:
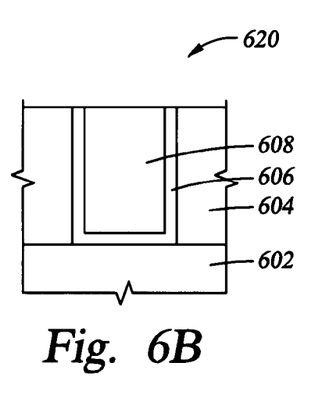
Figure 6C:
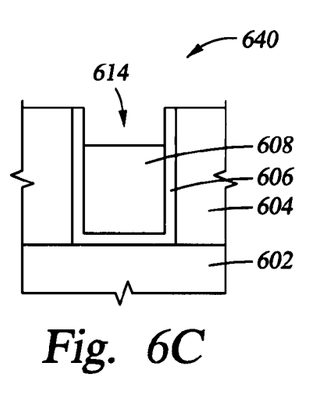
Figure 6D:
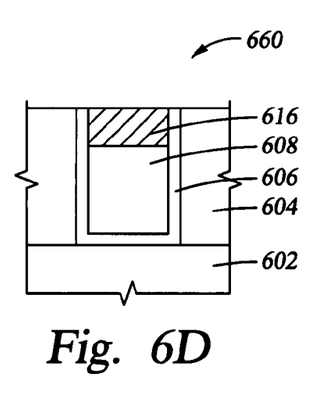
Figure 6E:
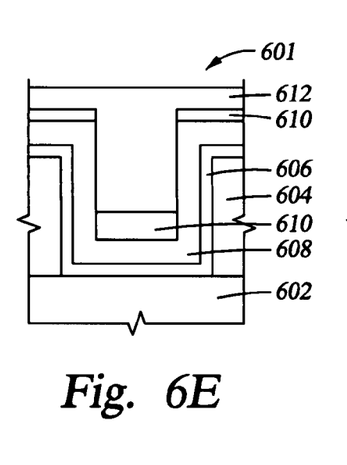
FIGS. 6E through 6H illustrate the fabrication of the larger gate structure designed for a manufacturing node of larger than 15 nm. The larger gate structure is present on the same substrate as the gate structure illustrated in FIGS. 6A through 6D. The processing is simultaneous and the same process steps are discussed with reference to FIGS. 6E through 6H.
Figure 6F:
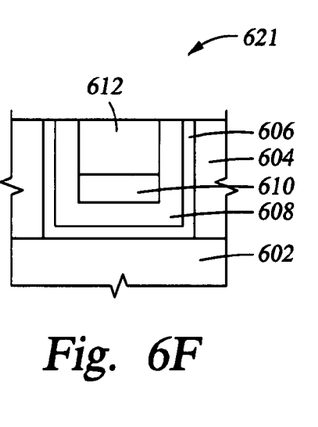

A liner layer 610 of Ti, DB/WF material, is then applied by PVD, to rapidly cover the conformal layer 608 which was previously deposited in the long channel gate trench, as shown in FIG. 6E. The thickness of this Ti layer is about 5 nm. Subsequently, a layer of aluminum fill 612 is applied using PVD over the conformal layer 608. The thickness of the Al layer is about 200 nm. The metal in the filled, metal comprising trenches is then reflowed.

After deposition of the layers described above, an optional CMP is typically carried out, to provide a uniform, level surface prior to the etch step which follows. The structure of the small channel gate is then as shown in FIG. 6B and the large channel gate in FIG. 6F.

An anisotropic, non-selective etch back is then performed to create a space in the top of each gate trench. The etch back RIE is performed using $Cl_2$, or $BCl_3$ source gas, for example to etch TiAl or TiN, for example; or using $SF_6$, or $NF_3$ source gas, for example, to etch WN or WSi. The etch back produces the small channel gate structure shown in FIG. 6C and the large channel gate structure shown in FIG. 6G.

Figure 6G:
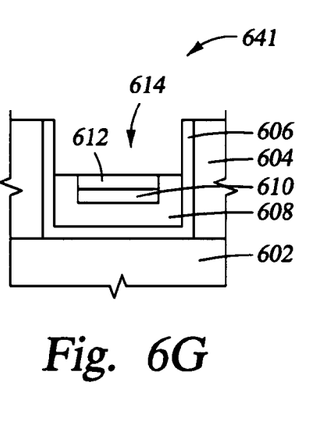
Figure 6H:
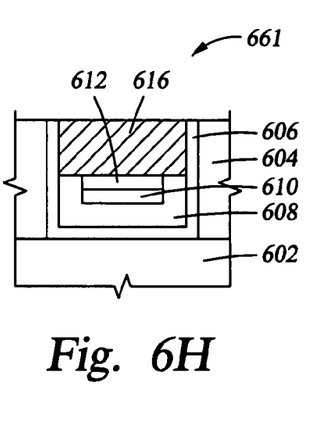

The open spaces 614 created at the top of the gate structures, as shown in FIGS. 6C and 6G are then filled with a highly conductive metal such as Al, W, Co, and combinations thereof, by way of example, as shown in FIG. 6D for the short channel gate and in FIG. 6H for the long channel gate. The installation of the highly conductive metal into the top portion of both of the filled metal-comprising gate structures increases the overall performance speed of the gates, while the stability of the overall gate structures is maintained.

FIGS. 7A-7H show a set of processing steps which are used for simultaneous fabrication of short channel and long channel gates on a single substrate. The short (small channel) gate structures typically have a trench CD of 20 nm or smaller. The large channel gate structures typically have a trench CD ranging from larger than 15 nm up to about 60 nm.

Figure 7A:
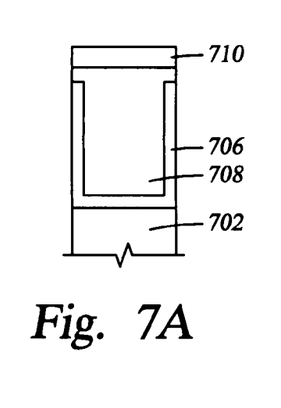
FIGS. 7A through 7D illustrate a fifth series of process steps for fabrication of a fifth embodiment gate structure where the gate size is designed for a manufacturing node of 15 nm or lower, and where there are multiple sized gates processed simultaneously on a common substrate.

The trench liner of high k dielectric previously described herein is present as a liner layer in all of the gate trenches. The thickness of the high k dielectric layer 706 is about 2 nm. A layer of a DB/WF material 708, selected from TiN, TiAl, TaAl, TiAlC, TaAlC, WSi, WN TaSi, TaSiAl, TaN, TaC, HfC, and combinations thereof is applied conformally using ALD or CVD to produce a DB/WF layer which is about 8 nm thick. The DB/WF layer 708 completely fills the short channel gate trench, as shown in FIG. 7A, due to the CD of the trench.

Subsequently, a layer of Ti—Al or W fill, or a combination thereof, for example, 710 is applied using CVD or PVD, followed by reflow. The resultant structures are illustrated in FIG. 7A for the short channel gate and in FIG. 7E for the long channel gate.

Figure 7B:
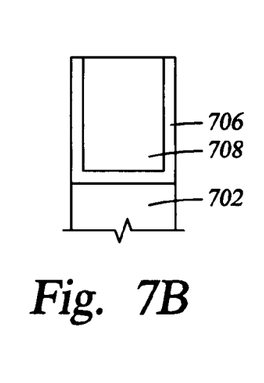

After deposition of the layers described above, an optional CMP is typically carried out, to provide a uniform, level surface prior to the etch step which follows. The structure of the small channel gate is then as shown in FIG. 7B and the large channel gate is as shown in FIG. 7F.

An anisotropic, non-selective etch back is then performed to create a space in the top of each channel trench. The etch back RIE is performed using $Cl_2$ or $BCl_3$ source gas, for example to etch TiAl or TiN; or using $SF_6$ or $NF_3$ source gas, for example, to etch WN or WSi. The etch back produces the small channel gate structure shown in FIG. 7C and the large channel gate structure shown in FIG. 7G.

Figure 7C:
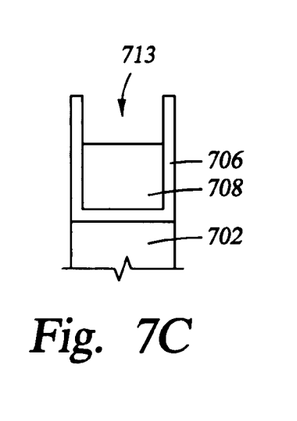
Figure 7D:
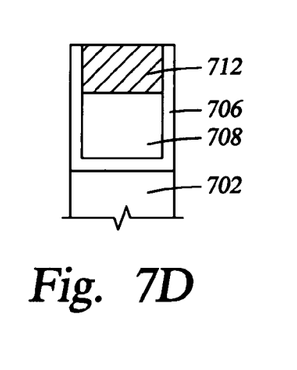
Figure 7E:
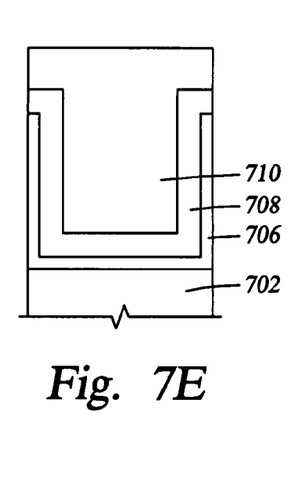
FIGS. 7E through 7H illustrate the fabrication of the larger gate structure designed for a manufacturing node of larger than 15 nm. The larger gate structure is present on the same substrate as the gate structure illustrated in FIGS. 7A through 7D. The processing is simultaneous and the same process steps are discussed with reference to FIGS. 7E through 7H.
Figure 7F:
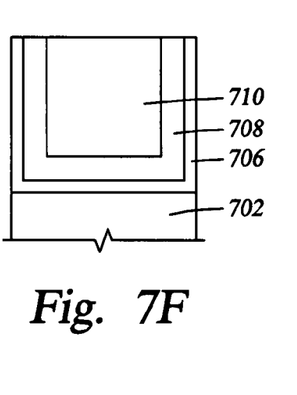
Figure 7G:
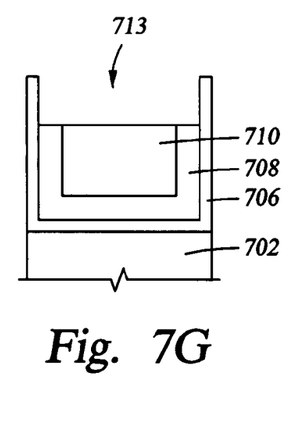
Figure 7H:
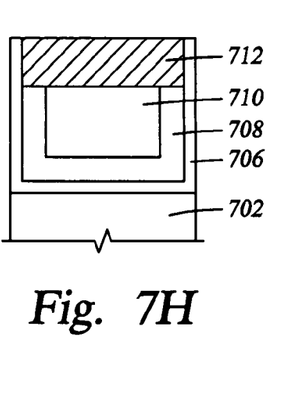

The open spaces 713 created at the top of the small channel and large channel gate structures, as shown in FIGS. 7C and 7N, respectively, are then filled using a selective metal on metal deposition of a highly conductive metal such as Co using CVD, as described in U.S. Patent Publication 2009/0269507, or Co applied using electro less plating. The selective metal on metal deposition is carried out using a process such as electro less plating. The final gate structures produced are illustrated in FIG. 7D for the small channel gate and in FIG. 7H for the large channel gate. The advantage of this process is that it is possible to avoid the need for a second CMP step after the deposition of the top layer 712 of the highly conductive metal, thus reducing cost and complication of the semiconductor substrate processing.

FIGS. 8A-8F show a set of processing steps which are used for simultaneous fabrication of short channel and long channel gates on a single substrate. The small channel gate structures typically have a trench CD of 15 nm or smaller. The large channel gate structures typically have a trench CD ranging from larger than 15 nm up to about 60 nm.

Figure 8A:
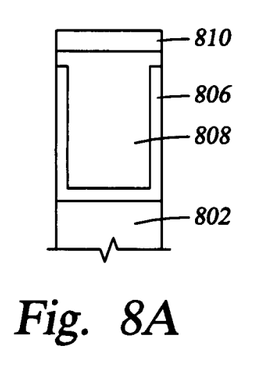
FIGS. 8A through 8C illustrate a sixth series of process steps for fabrication of a sixth embodiment gate structure where the gate size is designed for a manufacturing node of 15 nm or lower, and where there are multiple sized gates processed simultaneously on a common substrate.

The trench liner of high k dielectric previously described herein is present as a liner layer in all of the gate trenches. The thickness of the high k dielectric layer 806 is about 2 nm. A layer of a DB/WF material 808, selected from TiN, TiAl, TaAl, TiAlC, TaAlC, WSi, WN TaSi, TaSiAl, TaN, TaC, HfC, and combinations thereof is applied conformally using ALD or CVD to produce a DB/WF layer which is about 8 nm thick. The DB/WF layer 808 completely fills the short channel gate trench, as shown in FIG. 8A, due to the CD of the trench.

Subsequently, a layer of Ti—Al, W, or Co—Al fill, or a combination thereof, for example, 810 is applied using CVD or PVD, followed by reflow. The resultant structures are illustrated in FIG. 8A for the short channel gate and in FIG. 8D for the long channel gate.

Figure 8B:
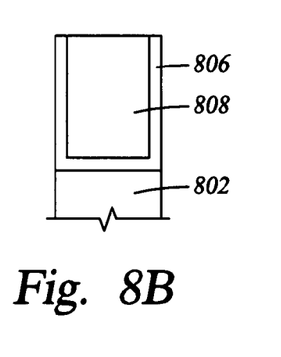

After deposition of the layers described above, a CMP is carried out, to provide a uniform, level surface prior to the selective metal deposition step which follows. The structure of the small channel gate is then as shown in FIG. 8B and the large channel gate in FIG. 8E.

Figure 8C:
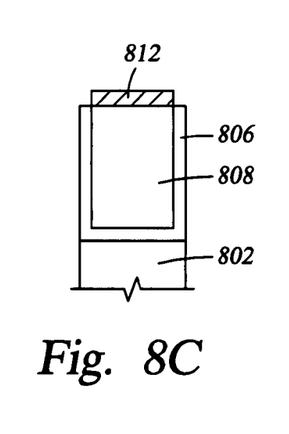
Figure 8D:
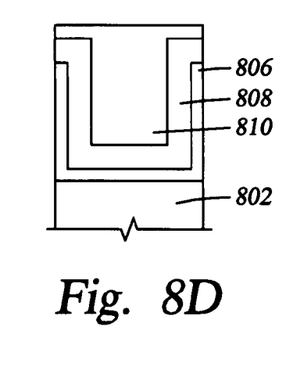
FIGS. 8D through 8F illustrate the fabrication of the larger gate structure designed for a manufacturing node of larger than 15 nm. The larger gate structure is present on the same substrate as the gate structure illustrated in FIGS. 8A through 8C. The processing is simultaneous and the process steps are discussed with reference to FIGS. 8A through 8F.
Figure 8E:
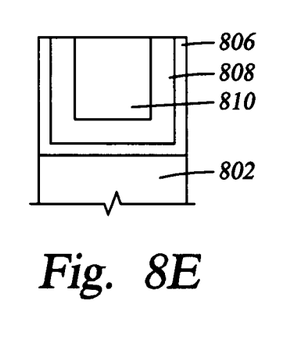
Figure 8F:
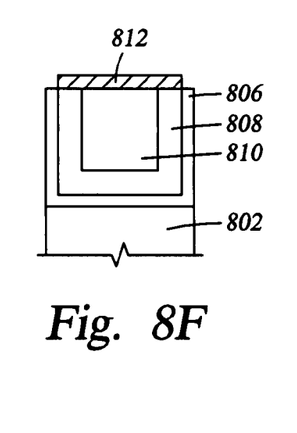

A selective metal on metal deposition is then carried out using CVD of Co, or electro less plating of CoWP, for example. The final gate structures produced are illustrated in FIG. 8C for the small channel gate and in FIG. 8F for the large channel gate. The advantage of this process is that it is possible to increase the gate speed by use of a more conductive metal on the surface of the filled metal-comprising gate. However the improvement in gate speed is not expected to be as high as that achieved using an etch back process, where the amount of DB/WF fill in the trenches of the gates is reduced and the amount of a more conductive metal present is more substantially increased. The main advantage of this fabrication method is the simplicity and reduction in production costs.

Figure 9A:
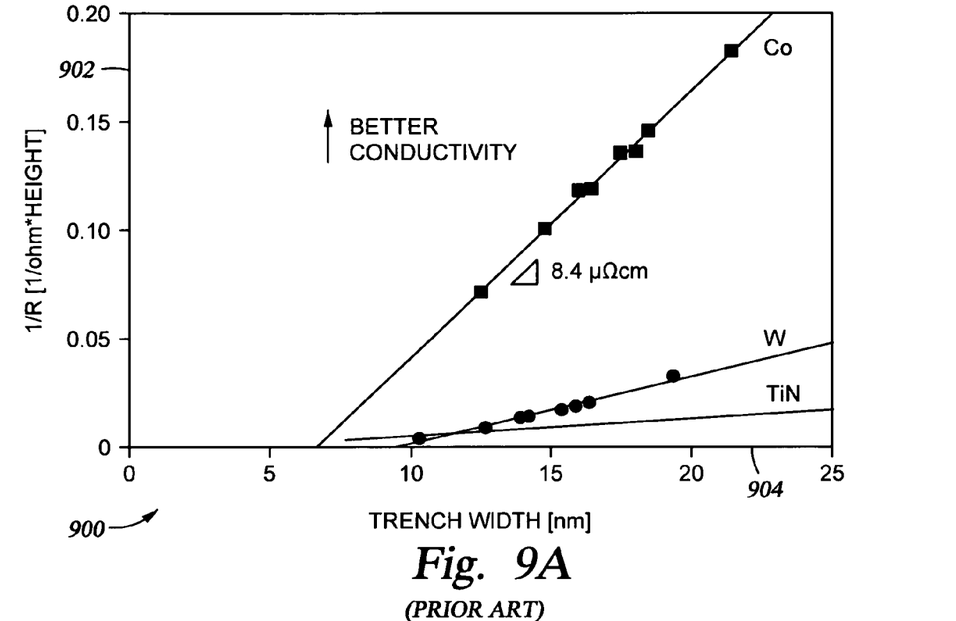
FIG. 9A shows a graph 900 with conductance on scale 902 versus trench width shown on scale 904 for three metal or metal-comprising materials which are known in the art.
Figure 9B:
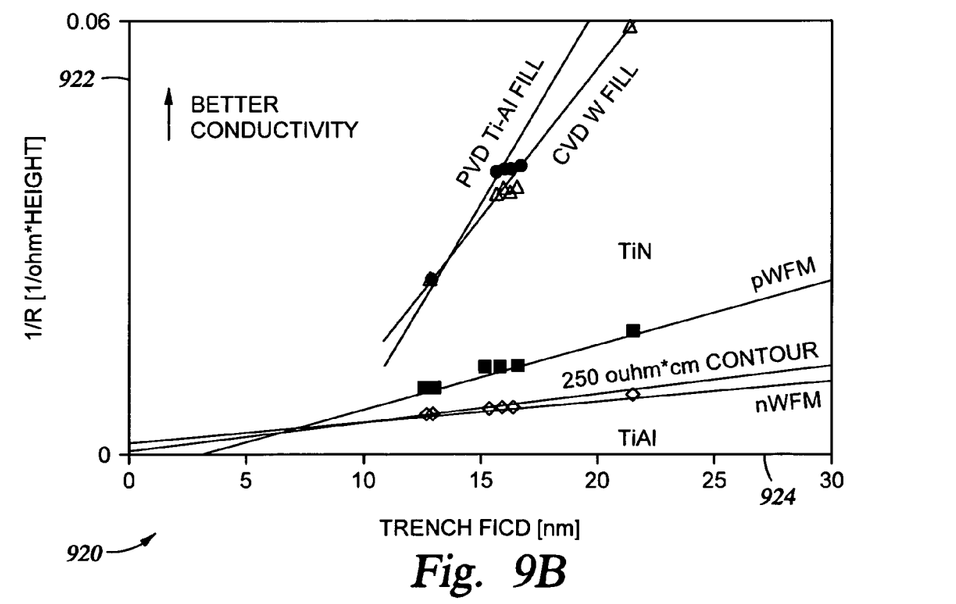
FIG. 9B shows a graph 920 with conductance on scale 922 versus trench FICD shown on scale 924, for various metal fill materials deposited using various means of deposition.
Figure 9C:
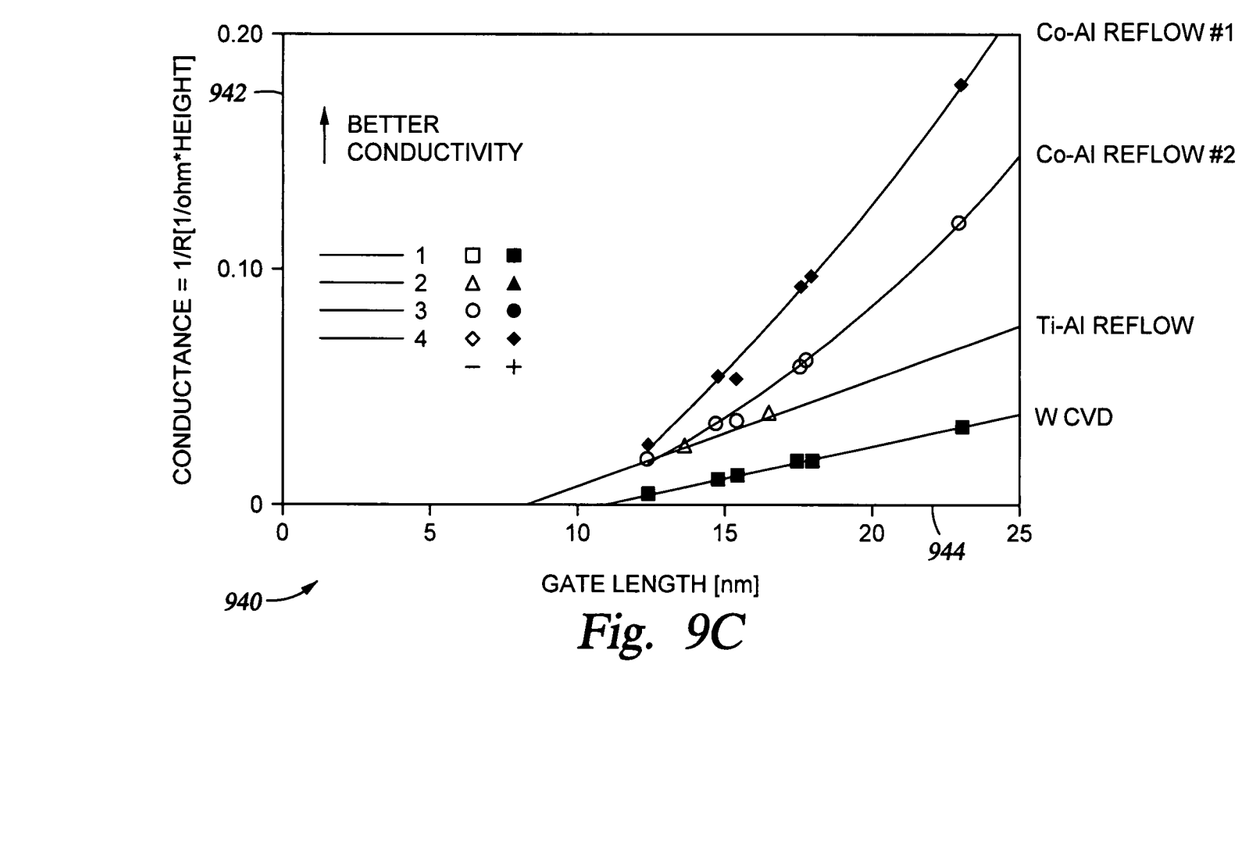
FIG. 9C shows a graph 940 with conductance on scale 942 versus gate length on scale 944, for various metals and metal alloys. The materials which were reflowed were deposited by atomic layer deposition.

FIGS. 9A through 9C show graphs which relate gate channel size (trench width) to conductance of the gate (trench) for various metal trench fill materials. FIG. 9A presents data known in the industry, where scale 902 represents the conductance of a metal fill in a gate trench, and scale 904 represents the trench width in nm. It is readily apparent that as the manufacturing node which requires a 15 nm trench size causes a substantial reduction in conductance of metal filled gate structures, thereby reducing the gate speed. Cobalt appears to be the best metal fill for gates in terms of operating speed, however this metal is difficult to work.

FIG. 9B shows data developed for combinations of materials of the kind described above for use in the filled, metal-comprising gate structures. Scale 922 represents the conductance of the metal fill within a gate trench, and scale 924 represents the trench width in nm. FIG. 9C represents data for metal gate fills which are created using a reflow process, and for CVD tungsten. Scale 942 represents the conductance of the metal fill within a gate trench, and scale 944 represents the gate length (trench width) in nm. Clearly the Co—Al reflowed materials provide better conductivity than previously-known materials.

The above described exemplary embodiments are not intended to limit the scope of the present invention, as one skilled in the art can, in view of the present disclosure, expand such embodiments to correspond with the subject matter of the invention claimed below.

We claim:

1. A method of simultaneously forming filled metal-comprising gate structures having more than one channel length for use in field effect transistors such as a planar FET or a Fin-FET, said method comprising:
   forming FETs having more than one channel length simultaneously on a single substrate, wherein a first channel length is 15 nm or less, and at least one additional channel length ranges between more than 15 nm to about 60 nm, wherein a gap fill material which is not present in said first channel length is present in said at least one additional channel length, and wherein a single series of steps are carried out to simultaneously form said filled metal-comprising gate structures, which steps include deposition of a plurality of layers of material, etchback of at least one layer of material, and chemical mechanical polishing of at least one layer of material.

2. A method in accordance with claim 1, wherein a high k dielectric liner layer is applied to a trench interior surface within a semiconductor substrate; followed by
   deposition of a DB/WF layer of material selected from the group consisting of TiN, TiAl, TaAl, TiAlC, TaAlC, WSi, WN or combinations thereof, wherein said layer is deposited using ALD or CVD; followed by
   deposition of a more conductive fill layer of Ti—Al, W, or a combination thereof, wherein said fill is applied using CVD or PVD and a reflow is conducted after deposition of said fill; followed by
   chemical mechanical polishing (CMP) of an upper surface of said trench area to provide removal of excess metal extending above said dielectric liner layer; followed by
   a non selective etch back of both said DB/WF layer and said metal fill using an RIE where a gas used to create said RIE is selected from $Cl_2$, $BCl_3$, or a combination thereof when a metal-comprising material being etched is TiAl, TiN, or a combination thereof, and a gas used to create said RIE is selected from $SF_6$, $NF_3$, or a combination thereof when a metal-comprising material being etched is SN, WSi, or a combination thereof; followed by
   filling a space created by said etch back with a highly conductive metal selected from the group consisting of Al, W, Co, and combinations thereof using a CVD or PVD process followed by reflow.

3. A method in accordance with claim 1, wherein a high k dielectric liner layer is applied to a trench interior surface within a semiconductor substrate; followed by
   deposition of a DB/WF layer of material selected from the group consisting of TiN, TiAl, TaAl, TiAlC, TaAlC, WSi, WN or combinations thereof, wherein said layer is deposited using ALD or CVD;
   chemical mechanical polishing of an upper surface of said trench area to provide removal of excess metal extending above said dielectric liner layer; followed by
   deposition of a fill of a more conductive fill layer of Ti—Al, Co—Al, Al, W, Co, or a combination thereof, wherein said fill is applied using CVD or PVD and a reflow is conducted after deposition of said fill; followed by
   a selective etch back of the DB/WF layer of material which does not affect said more conductive fill layer, wherein said selective etch back is conducted by RIE or a wet etch, where a gas used to create said RIE is selected from $Cl_2$, $BCl_3$, or a combination thereof when a metal-comprising material being etched is TiAl, TaAl, TiN, or a combination thereof, and a gas used to create the RIE is selected from $SF_6$, $NF_3$, or a combination thereof when a metal-comprising material being etched is SN, WSi, or a combination thereof, and wherein a wet etch is APM when TiN or TiAl is being etched; followed by
   filling the space created by the etch back with a highly conductive metal selected from the group consisting of Al, W, Co, and combinations thereof using a CVD or PVD process followed by reflow, to increase the speed of said gate.

4. A method in accordance with claim 1, wherein a high k dielectric liner layer is applied to a trench interior surface within a semiconductor substrate, followed by
   deposition of a DB/WF layer of material selected from the group consisting of TiN, TiAl, TaAl, TiAlC, TaAlC, WSi, WN or combinations thereof, wherein said layer is deposited using ALD or CVD;
   chemical mechanical polishing of an upper surface of said trench area to provide removal of excess metal extending above said dielectric liner layer; followed by
   deposition of a fill of a more conductive fill layer of Ti—Al, Co—Al, Al, W, Co, or a combination thereof, wherein said fill is applied using CVD or PVD and a reflow is conducted after deposition of said fill; followed by
   a selective etch back of the DB/WF layer of material which does not affect said more conductive fill layer, wherein said selective etch back is conducted by RIE or a wet etch, where a gas used to create said RIE is selected from $Cl_2$, $BCl_3$, or a combination thereof when a metal-comprising material being etched is TiAl, TaAl, TiN, or a combination thereof, and a gas used to create the RIE is selected from SF$_6$, NF$_3$, or a combination thereof when a metal-comprising material being etched is SN, WSi, or a combination thereof, and wherein a wet etch is APM when TiN or TiAl is being etched; followed by filling a space created by the etch back with a dielectric film selected from the group consisting of SiN, SiON, SiCn and combinations thereof using a CVD or PVD, to produce a self aligned exterior layer around said high conductivity fill layer at the surface of said FET, to protect against short circuiting between an electrical contact which may be improperly landed.

5. A method in accordance with claim 1, wherein a high k dielectric liner layer is applied to a trench interior surface within a semiconductor substrate; followed by deposition of a DB/WF layer of material selected from the group consisting of TiN, TiAl, TaAl, TiAlC, TaAlC, WSi, WN and combinations thereof, wherein said layer is deposited using ALD or CVD; followed by deposition of a second DB/WF layer of material selected from the group consisting of TiN, TiAl, TaAl, WSi, WN TiN, Ti and combinations thereof, wherein said layer is deposited using PVD; followed by anisotropically etching back deposited layers in a manner such that at least a portion of said DB/WF layer deposited by PVD remains near the bottom of a trench interior surface within a gate having a channel length which ranges between more than 15 nm to about 60 nm, wherein said etching is RIE etching and wherein RIE is produced from gases selected from Cl$_2$, BCl$_3$ and combinations thereof when TiAl, TiN, or combinations thereof is etched, or from gases selected from SF$_6$, NF$_3$, and combinations thereof when WN, WSi, and combinations thereof is etched; followed by depositing a filling layer of highly conductive metal selected from the group consisting of Al, W, Co, and combinations thereof using CVD, PVD, or a combination thereof.

6. A method in accordance with claim 1, wherein a high k dielectric liner layer is applied to a trench interior surface within a semiconductor substrate, followed by deposition of a DB/WF layer of material selected from the group consisting of TiN, TiAl, TaAl, TiAlC, TaAlC, WSi, WN or combinations thereof, wherein said layer is deposited using ALD or CVD; followed by deposition of a layer of Ti over said layer of DB/WF material, wherein said Ti layer is deposited using PVD; followed by deposition of a layer of Al by PVD, followed by reflow, to create a fill over said DB/WF layer, wherein said fill has a composition Ti/TiAl/Al, where Ti is adjacent said DB/WF layer and TiAl overlies Ti, and Al overlies TiAl; followed by chemical mechanical polishing (CMP) of an upper surface of said trench area to provide removal of excess metal extending above said dielectric liner layer; followed by a non selective etch back of both said DB/WF layer and said metal fill using an RIE where a gas used to create the RIE is selected from Cl$_2$, BCl$_3$, or a combination thereof when a metal-comprising material being etched is TiAl, TiN, or a combination thereof, and a gas used to create the RIE is selected from SF$_6$, NF$_3$, or a combination thereof when a metal-comprising material being etched is SN, WSi, or a combination thereof; followed by filling the space created by said etch back with a highly conductive metal selected from the group consisting of Al, W, Co, and combinations thereof using a CVD or PVD process followed by reflow.

7. A method in accordance with claim 1, wherein a high k dielectric liner layer is applied to a trench interior surface within a semiconductor substrate, followed by deposition of a DB/WF layer of material selected from the group consisting of TiN, TiAl, TaAl, TiAlC, TaAlC, WSi, WN or combinations thereof, wherein said layer is deposited using ALD or CVD; followed by deposition of a more conductive fill layer of Ti—Al, W, or a combination thereof, wherein said fill is applied using CVD or PVD and a reflow is conducted after deposition of said fill; followed by chemical mechanical polishing (CMP) of an upper surface of said trench area to provide removal of excess metal extending above said dielectric liner layer; followed by a non selective etch back of both said DB/WF layer and said metal fill using an RIE where a gas used to create the RIE is selected from Cl$_2$, BCl$_3$, or a combination thereof when a metal-comprising material being etched is TiAl, TiN, or a combination thereof, and a gas used to create the RIE is selected from SF$_6$, NF$_3$, or a combination thereof when a metal-comprising material being etched is SN, WSi, or a combination thereof; followed by selective deposition of a conductive metal upon metal, with said conductive metal depositing on metal surfaces contained within a high k dielectric liner, said selective deposition filling a space created by the etch back with a highly conductive metal selected from the group consisting of Co applied by CVD, electro less plating with CoWP.

8. A method in accordance with claim 1, wherein a high k electric liner layer is applied to a trench interior surface within a semiconductor substrate, followed by deposition of a DB/WF layer of material selected from the group consisting of TiN, TiAl, TaAl, TiAlC, TaAlC, WSi, WN or combinations thereof, wherein said layer is deposited using ALD or CVD; followed by deposition of a more conductive fill layer of Ti—Al, W, or a combination thereof, wherein said fill is applied using CVD or PVD and a reflow is conducted after deposition of said fill; followed by chemical mechanical polishing (CMP) of an upper surface of said trench area to provide removal of excess metal extending above said dielectric liner layer; followed by selective deposition of a conductive metal upon metal, with said conductive metal depositing on metal gate surfaces which are surrounded said by high k dielectric liner layer, wherein said conductive metal deposited is selected from the group consisting of Co applied by CVD, electro less plating with CoWP.

* * * * *